United States Patent
Li et al.

(10) Patent No.: US 8,350,264 B2
(45) Date of Patent: Jan. 8, 2013

(54) SECURE ANTI-FUSE WITH LOW VOLTAGE PROGRAMMING THROUGH LOCALIZED DIFFUSION HEATING

(75) Inventors: Yan Zun Li, Lagrangeville, NY (US); Chandrasekharan Kothandaraman, Hopewell Junction, NY (US); Dan Moy, Bethel, CT (US); Norman W. Robson, Hopewell Junction, NY (US); John M. Safran, Wappingers Falls, NY (US)

(73) Assignee: International Businesss Machines Corporation, Armonk, NY (US)

( * ) Notice: Subject to any disclaimer, the term of this patent is extended or adjusted under 35 U.S.C. 154(b) by 126 days.

(21) Appl. No.: 12/835,764

(22) Filed: Jul. 14, 2010

(65) Prior Publication Data

US 2012/0012977 A1  Jan. 19, 2012

(51) Int. Cl.
*H01L 29/04* (2006.01)

(52) U.S. Cl. .................. 257/50; 257/530; 257/E23.147; 438/131; 438/467; 438/468

(58) Field of Classification Search ............ 257/50, 257/530, E23.147, E21.591, E21.592; 438/131, 438/466, 467, 468
See application file for complete search history.

(56) References Cited

U.S. PATENT DOCUMENTS

| | | | |
|---|---|---|---|
| 6,031,275 A | 2/2000 | Kalnitsky et al. | |
| 6,515,344 B1 | 2/2003 | Wollesen | |
| 6,657,531 B2 | 12/2003 | Kimura et al. | |
| 7,507,607 B1 | 3/2009 | Dark et al. | |
| 7,598,749 B1 * | 10/2009 | Ang et al. | 324/550 |
| 7,691,684 B2 | 4/2010 | Breitwisch et al. | |
| 2006/0087001 A1 * | 4/2006 | Kothandaraman et al. | 257/529 |
| 2006/0102982 A1 | 5/2006 | Park et al. | |
| 2008/0067608 A1 * | 3/2008 | Hsu et al. | 257/379 |
| 2008/0073749 A1 | 3/2008 | Park et al. | |
| 2008/0111210 A1 | 5/2008 | Park et al. | |
| 2008/0157125 A1 | 7/2008 | Kim et al. | |
| 2008/0217658 A1 * | 9/2008 | Kim et al. | 257/209 |
| 2009/0052221 A1 * | 2/2009 | Ogawa | 365/96 |
| 2009/0108400 A1 | 4/2009 | Cestero et al. | |
| 2009/0224323 A1 * | 9/2009 | Im et al. | 257/355 |
| 2009/0256624 A1 * | 10/2009 | Kim et al. | 327/525 |
| 2009/0283840 A1 | 11/2009 | Coolbaugh et al. | |
| 2010/0032732 A1 | 2/2010 | Booth, Jr. et al. | |
| 2010/0164603 A1 * | 7/2010 | Hafez et al. | 327/525 |
| 2012/0044757 A1 * | 2/2012 | Chung | 365/173 |

* cited by examiner

*Primary Examiner* — Tom Thomas
*Assistant Examiner* — Christopher M Roland
(74) *Attorney, Agent, or Firm* — Daryl K. Neff; Lily S. Neff; Katherine S. Brown (57) ABSTRACT

An antifuse is provided having a unitary monocrystalline semiconductor body including first and second semiconductor regions each having the same first conductivity type, and a third semiconductor region between the first and second semiconductor regions which has a second conductivity type opposite from the first conductivity type. An anode and a cathode can be electrically connected with the first semiconductor region. A conductive region including a metal, a conductive compound of a metal or an alloy of a metal can contact the first semiconductor region and extend between the cathode and the anode. The antifuse can further include a contact electrically connected with the second semiconductor region. In this way, the antifuse can be configured such that the application of a programming voltage between the anode and the cathode heats the first semiconductor region sufficiently to reach a temperature which drives a dopant outwardly therefrom, causing an edge of the first semiconductor region to move closer to an adjacent edge of the second semiconductor region, thus permanently reducing electrical resistance between the first and second semiconductor regions by one or more orders of magnitude.

20 Claims, 4 Drawing Sheets

SECURE ANTI-FUSE WITH LOW VOLTAGE PROGRAMMING THROUGH LOCALIZED DIFFUSION HEATING

BACKGROUND OF THE INVENTION

1. Field of the Invention

The subject matter of the present application relates to electrical antifuses, especially such devices provided in integrated circuit chips.

2. Description of the Related Art

Integrated circuit chips often include elements which can be permanently altered after manufacture in order to make certain changes to circuits therein, or to maintain states or data on the chip. For example, an integrated circuit chip can include electrically operable fuses or an array of fuses to store critical information on chip, to conduct redundancy repair to improve manufacturing yield, or to fine tune circuit performance through local circuit trimming, among other purposes. Such fuses initially begin as conductive elements, i.e., devices which are closed circuit in that initially, they are electrically connected between external terminals. A fuse can be programmed, i.e., blown, to make it much less conductive, i.e., open circuited in that it effectively is no longer electrically connected between external terminals Electrical antifuses are alternative structures which can be provided on an integrated circuit. Such antifuses typically begin as elements which are essentially nonconductive, having high electrical resistance (i.e., open circuit state). Programming an antifuse greatly reduces the electrical resistance of the antifuse to a level at which the antifuse is electrically connected between external terminals, achieving in effect a closed circuit state.

One challenge faced by electrical fuses and antifuses used in integrated circuit chips is the ability to reliably program the fuse or antifuse. During programming, an electrical fuse may require a metal fuse link to melt under high current, which can cause local explosion with metal particles scattered far away from the blown fuse or stress cracks to form in adjacent dielectric materials and affect nearby circuits. In some existing electrical antifuses, a high voltage is applied across a thin dielectric layer to create a localized breakdown that is electrically conductive. These types of fuses and antifuses can sometimes fail to change completely to a programmed state, such that a fuse can remain relatively conductive even after programming, and an antifuse may remain too resistive after programming. In some cases, only 90-99% of these devices work properly when programmed. Another challenge for many of the fuse or antifuse solutions today which utilize such destructive mechanisms is the ability to maintain the programmed state of the fuse or antifuse throughout its useful life time. In aggravated application environments such as high temperature, some programmed fuses and antifuses may gradually change back into their previous unprogrammed states.

Moreover, fuses and antifuses may require special high voltage levels available on the integrated circuit chip for programming them. This can pose design challenges for supplying the voltage levels on the chip and contributes to the overall cost of making the chip.

SUMMARY OF THE INVENTION

An antifuse is provided having a unitary monocrystalline semiconductor body including first and second semiconductor regions each having the same first conductivity type, and a third semiconductor region between the first and second semiconductor regions which has a second conductivity type opposite from the first conductivity type. An anode and a cathode can be electrically connected with the first semiconductor region. A conductive region including a conductive compound of a metal can contact the first semiconductor region and extend between the cathode and the anode. The antifuse can further include a contact electrically connected with the second semiconductor region. In this way, the antifuse can be configured such that the application of a programming voltage between the anode and the cathode heats the first semiconductor region sufficiently to reach a temperature which drives a dopant outwardly therefrom, causing an edge of the first semiconductor region to move closer to an adjacent edge of the second semiconductor region, thus permanently reducing electrical resistance between the first and second semiconductor regions by one or more orders of magnitude. The contact to the second semiconductor region typically is usable to measure an electrical characteristic to detect whether or not the antifuse is in a programmed state.

While in the unprogrammed state, the first and second semiconductor regions can be separated by a distance comparable to the width of a gate of the antifuse that overlies the third semiconductor region. In one embodiment, the edge of at least the first semiconductor region moves sufficiently to overlap the adjacent edge of the second semiconductor region in the programmed state.

In one embodiment, the resistance of the antifuse can be higher than 100,000 ohms before the antifuse has been programmed, and can be less than 10,000 ohms after the antifuse has been programmed. In a particular embodiment, the application of the programming voltage can reduce resistance between the first and second semiconductor regions by three or more orders of magnitude.

An integrated circuit chip which includes the antifuse may further include a field effect transistor. In such case, the magnitude of the programming voltage may need not be greater than the magnitude of a gate-source voltage usable to switch the field effect transistor from fully off to fully on operation.

In one embodiment, application of the programming voltage heats the body to a temperature sufficient to cause movement of the edge of the first semiconductor region sufficient to produce the one or more order of magnitude reduction in resistance without melting either the conductive region, e.g., silicide region, or the semiconductor material of the body.

In one embodiment, the antifuse can include a gate overlying the third semiconductor region. In a particular embodiment, the anode and the cathode can be spaced apart in a direction parallel to the length of the gate.

In one embodiment, the antifuse can include a plurality of the first semiconductor regions and a plurality of the second semiconductor regions, and the gate can include a plurality of fingers, each separating a second semiconductor region from a first semiconductor region.

In one embodiment, the body of the antifuse is adapted to reach a temperature greater than 700° C. under application of the programming voltage. The antifuse can be adapted to cause movement in at least the edge of the first semiconductor region sufficient to produce the one or more order of magnitude reduction in resistance under application of the programming voltage for a period of less than 1000 microseconds.

In a particular embodiment, the antifuse can be adapted to reach a temperature of greater than 700° C. in the body and to cause movement in at least the edge of the first semiconductor region sufficient to produce the one or more order of magnitude reduction in resistance under application of the programming voltage for a period of less than 50 microseconds.

In a particular embodiment, the body of the antifuse can be provided in an active semiconductor device layer of a siliconon-insulator ("SOI") substrate, the SOI substrate including a bulk semiconductor layer and a buried dielectric layer separating the active semiconductor device layer from the bulk semiconductor layer.

An antifuse according to another embodiment of the invention can include a unitary monocrystalline semiconductor body which includes first and second semiconductor regions each having the same first conductivity type being one of n-type or p-type, and a third semiconductor region between the first and second semiconductor regions having a second conductivity type being one of n-type or p-type, the second conductivity type being opposite the first conductivity type. A gate overlies the third semiconductor region, the gate having a long dimension extending along a direction in which the third semiconductor region extends. A conductive region which includes a conductive compound of a metal contacts the first semiconductor region, the conductive region having a long dimension extending in a direction transverse to a direction of the long dimension of the gate. An anode is spaced apart from the first semiconductor region in a direction of the long dimension of the conductive region. The antifuse further includes a contact electrically connected with the second semiconductor region and serves as the cathode in this embodiment. Programming of the antifuse device in this particular embodiment may involve applying a voltage to the gate of the antifuse to turn transistor conduction of the antifuse fully on. For example, when the antifuse has first and second semiconductor regions of p-type conductivity and an n-type third semiconductor region underlying the gate, a "low" voltage can be applied to the gate during programming to turn transistor conduction on. Alternatively, when the antifuse has first and second semiconductor regions of n-type conductivity and a p-type third semiconductor region underlying the gate, a "high" voltage can be applied to the gate during programming to turn transistor conduction on. In this way, the antifuse can be configured such that the application of a programming voltage between the anode and the cathode heats the first semiconductor region sufficiently to reach a temperature which drives a dopant outwardly therefrom, causing an edge of the first semiconductor region to move closer to an adjacent edge of the second semiconductor region, thus permanently reducing electrical resistance between the first and second semiconductor regions by one or more orders of magnitude.

A method of programming an antifuse is provided according to another embodiment of the invention. In such method, an antifuse is provided which has a body including first and second semiconductor regions, wherein the first and second semiconductor regions have the same first conductivity type being one of n-type or p-type. A third semiconductor region is provided between the first and second semiconductor regions which has a second conductivity type being one of n-type or p-type, the second conductivity type being opposite the first conductivity type. The antifuse has an anode and a cathode electrically connected with the first semiconductor region, and a silicide region contacting the first semiconductor region and extending between the cathode and anode, and a contact electrically connected with the second semiconductor region. A programming voltage is applied between the anode and the cathode to heat the first semiconductor region sufficiently to reach a temperature which drives a dopant outwardly therefrom. In this way, an edge of the first semiconductor region is caused to move closer to an adjacent edge of the second semiconductor region, thus permanently reducing electrical resistance between the first and second semiconductor regions by one or more orders of magnitude.

DETAILED DESCRIPTION

Figure 1:
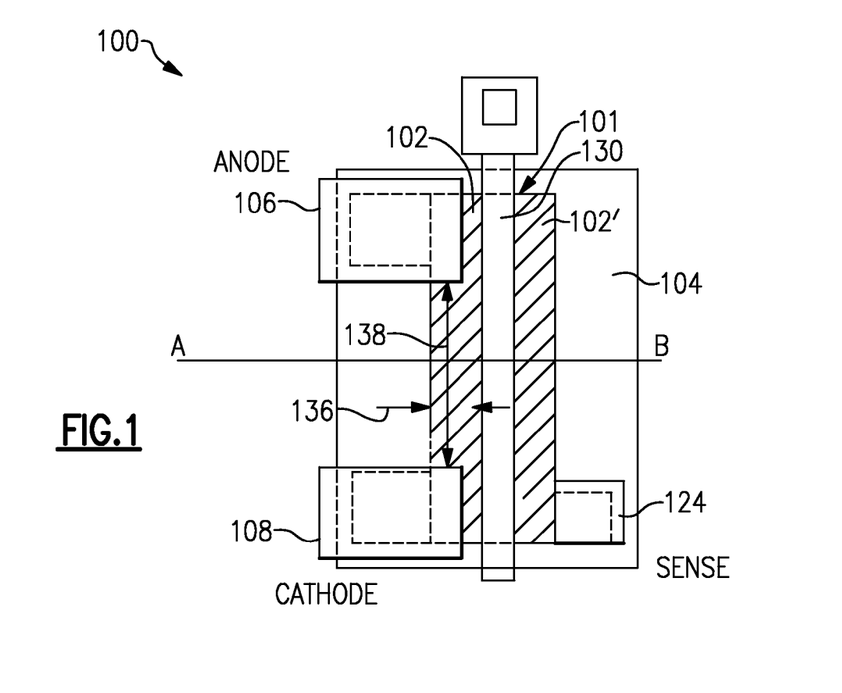
FIG. 1 is a plan view illustrating an antifuse according to one embodiment of the invention.
Figure 2:
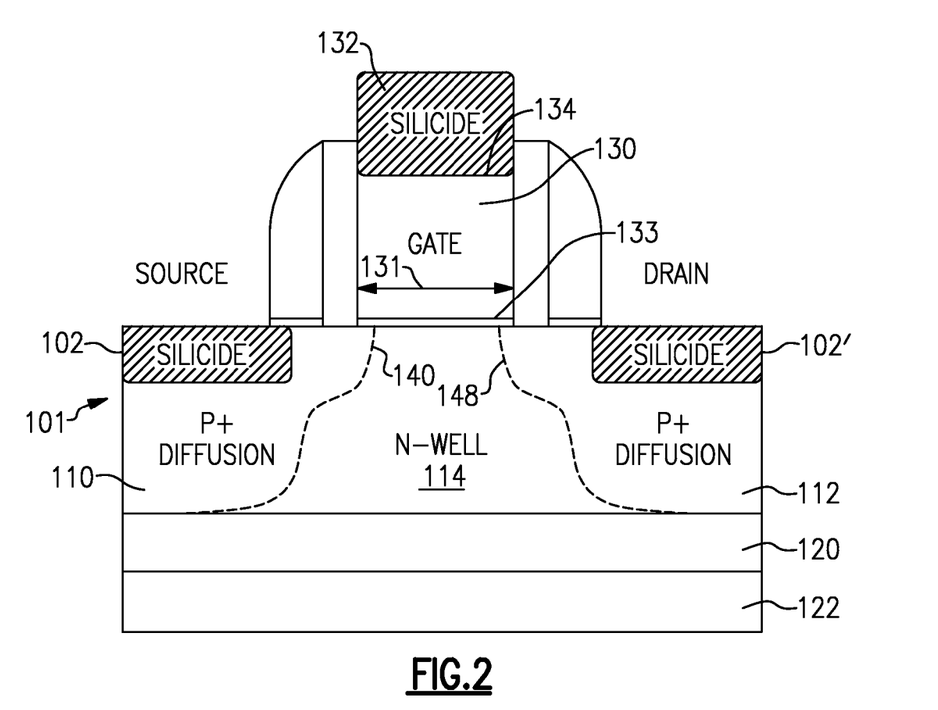
FIG. 2 is a sectional view through line A-B of FIG. 1, further illustrating the antifuse shown in FIG. 1.

FIGS. 1 and 2 are a plan view and a corresponding sectional view, respectively, of an antifuse in accordance with an embodiment of the invention. As seen therein, the antifuse 100 includes a unitary monocrystalline semiconductor body 101, i.e., an active semiconductor region of a substrate such as an integrated circuit chip. The body typically is provided in a unitary single-crystal region of semiconductor material such as silicon, although the semiconductor material can be another material such as an alloy of silicon with another semiconductor, or a III-V or II-VI compound semiconductor material, for example. In one example, the body can be electrically isolated by a region of dielectric material 104 which can surround the body in a first direction and in a second direction. In a particular example, the region of dielectric material can be a trench isolation region which can include an oxide of silicon, for example.

In one embodiment, the active semiconductor region 101 can be provided in a silicon-on-insulator ("SOI") substrate which further includes a buried dielectric or buried oxide ("BOX") layer 120 which separates the active semiconductor region from a bulk semiconductor region 122 of the substrate.

The body includes at least three regions of adjoining monocrystalline semiconductor material within the active semiconductor region 101: a first region 110 having a first conductivity type, (e.g., a p-type doped diffusion region as shown in FIG. 2), a second region 112 having the same conductivity type as the first region (e.g., a p-type doped diffusion region), and a third region 114 disposed between and adjoining the first and second regions, the third region having a second conductivity type (e.g., an n-type conductivity well) which is opposite the first conductivity type. The first and second semiconductor regions can be heavily doped, e.g., having a dopant concentration greater than about $10^{18}$ cm$^{-3}$, such that their dopant concentrations can be referred to as "p+" and the dopant concentration of the n-well is less heavily doped than the p+ doped region. The dopant concentration of the n-well can be in a range of $10^{14}$ cm$^{-3}$ to $10^{19}$ cm$^{-3}$ but typically will be less heavily doped than the p+ region in any case. In one example, when the semiconductor region consists essentially of silicon, the p-type dopant can be boron.

Conductive regions 102, 102' which can include a conductive compound or alloy of a metal, and in some cases, can include a metal, typically are provided at a surface of the body. Typically, the conductive regions 102, 102' include a metal silicide when the active semiconductor region includes silicon. An anode 106 and a cathode 108 are conductive structures which contact the conductive region 102 from locations above the active semiconductor region 101. The anode and cathode typically are made of metal, a conductive compound of a metal or alloy of a metal or both. As seen in FIG. 1, the conductive region 102 extends between the anode and the cathode for conducting current therebetween. In a particular embodiment, conductive region 102' can be omitted if the antifuse 100 conducts an adequate current when the antifuse is in the programmed state, as will be further described below.

As further seen in FIG. 1, a gate 130 may overlie the third semiconductor region 114. The gate can be formed by processing used to form the gates of other active semiconductor devices of the chip, such as field effect transistors, for example. The width 131 of the gate 130 can be greater than the dimension of the third semiconductor region 114 between the adjacent edges 140, 148 of the first and second semiconductor regions, such that the gate 130 overlies the edges 140, 148. The width 131 of the gate can be the same as the width of the gates provided in field effect transistors of the same chip. In one example, when the width of a gate of a field effect transistor on the same chip is 22 nanometers, the width of the gate of the antifuse can be 22 nanometers. In another example, when the widths of gates of field effect transistors are 40 nanometers, the gate of the antifuse can also be 40 nanometers. In other examples, the width of the gate can be smaller than, or greater than the width of a gate of another device (e.g., field effect transistor) on the same chip.

Typically, the gate is separated from the body of the antifuse by a thin layer 133 of dielectric material, which can be referred to as a gate dielectric layer. Thus, before the antifuse is programmed, the portion of the antifuse that includes the body, the gate dielectric layer and the gate is similar to that of a p-type field effect transistor ("PFET"). However, although there is a gate 130, typically the gate is not used for the purpose of creating an inversion layer in the third semiconductor region 114 in a manner such as a gate is used to operate a field effect transistor.

A conductive region 132 may be further provided in contact with a top 134 surface of the gate 130 which faces away from the third semiconductor region 114. The antifuse typically also has a contact 124 (labeled "Sense" in FIG. 1) electrically connected with the second semiconductor region. As will be described in greater detail below, a voltage can be applied between the cathode 108 and the contact 124 in the antifuse 100 to determine whether the antifuse is in the unprogrammed or programmed state.

Dimensions of the antifuse can be the same or similar to other microelectronic devices, e.g., field effect transistors, etc., which are fabricated in the same semiconductor substrate as the antifuse. In a particular example, the length 138 of the conductive region 102 (e.g., silicide region) between the adjacent edges of the anode 106 and the cathode 108 can be 0.2 to 0.3 microns, and the width 136 of the conductive region 102 in a direction transverse to the length can range from 0.05 microns (50 nanometers) to 0.08 microns (80 nanometers).

Operation of the antifuse will now be described with reference to FIGS. 3-6. The antifuse can be programmed by applying a voltage between the anode 106 and the cathode 108 under conditions sufficient to heat the first semiconductor region 110 to a temperature at which a dopant diffuses outwardly therefrom towards the second semiconductor region 112. In one example, under application of the programming voltage the dopant diffuses from the first region to an extent that an edge of the first semiconductor region 110 moves from an initial first location 140 (before programming) to a second location 142 (after programming), which edge location now overlaps with an adjacent edge 150 of the second semiconductor region. In that event, the first and second semiconductor regions then bridge the gap 160 formerly occupied by the third semiconductor region and form a continuous semiconductor region that has the same first conductivity type (i.e., p-type) that the first and second semiconductor regions had before the antifuse was programmed.

Figure 3:
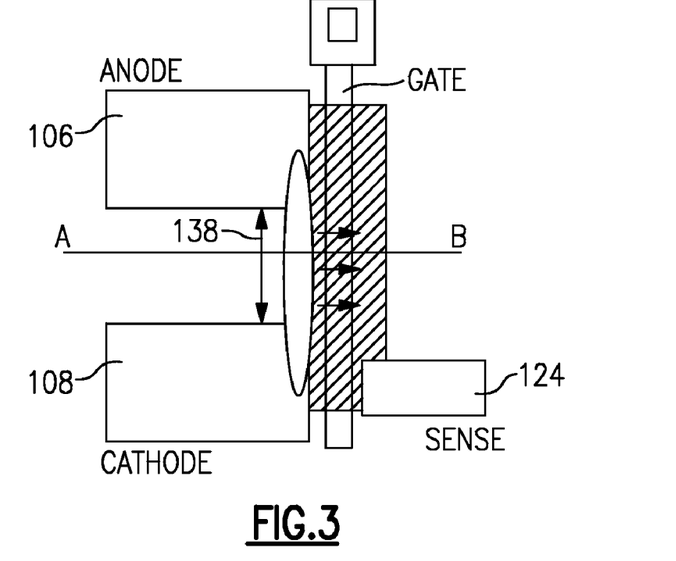
FIG. 3 is a plan view illustrating operation of the antifuse of FIGS. 1-2 while being programmed.
Figure 4:
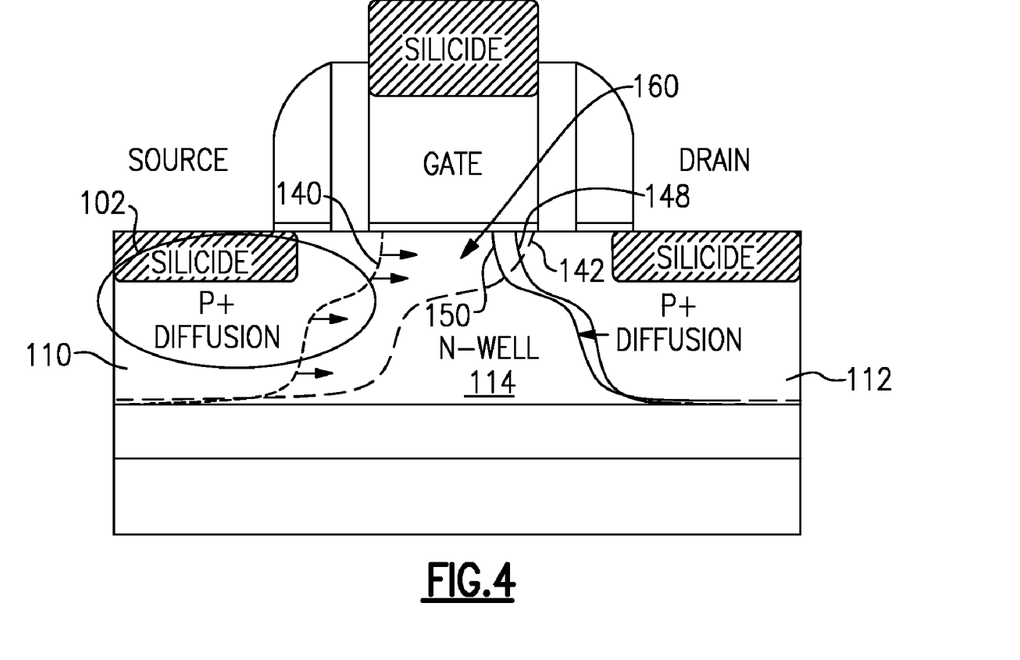
FIG. 4 is a sectional view illustrating operation of the antifuse of FIGS. 1-2 while being programmed.

Specific operation of the antifuse during programming is illustrated in FIGS. 3 and 4. As shown in FIG. 3, a programming voltage applied between the anode and the cathode causes a current to flow along the length 138 of the conductive region between the anode 106 and the cathode 108. The product of the current in the conductive region and the voltage between the anode and cathode produces resistive heating in a quantity P determined by the equation:

$$P = I \times V \quad (1)$$

where P is the resistive power consumption, I is the current and V is the voltage between the points of the conductive region in contact with the anode and the cathode. As depicted in FIG. 4, the resistive heating in the conductive region 102 raises the temperature therein and in the first semiconductor region 110 in contact therewith. Since the current within the conductive region is determined by the voltage between the anode and cathode divided by the resistance therebetween, the amount of resistive heating P can be determined alternatively as:

$$P = V^2/R \quad (2)$$

where again V is the voltage between anode and cathode and R is the resistance between the anode and the cathode. Therefore, achieving a conductive region which produces a correct amount of heating is a function of the voltage as well as the resistance between the anode and the cathode. The resistance of the conductive region 102 and the first semiconductor region 110 each contribute to the resistance R. However, in most cases only the resistance of the conductive region 102 need be considered because the resistance of the conductive region typically is much less than that of the first semiconductor region.

To achieve sufficient resistive heating in accordance with the relationship $P=V^2/R$, the conductive region 102 must be sufficiently resistive to produce a voltage drop V which permits the resistive heating. However, the resistance of the conductive region 102 cannot be so great as to make the quantity of resistive heating small. For this and other reasons, in one example, the conductive region can be implemented by a layer of metal silicide electrically contacting the first semiconductor region. Silicide typically is at least 10 times less resistive than typical heavily doped semiconductor material. However, silicide is significantly more resistive than metal. To achieve the correct amount of heating it may be necessary to provide the conductive region 102 as a metal silicide layer without any other layer extending parallel to the silicide layer having lower resistance than such silicide layer. In such case, the metal silicide layer will be the layer having the lowest electrical resistance between the edges of the anode and the cathode in the antifuse.

As further shown in FIG. 4, when a programming voltage is applied between the anode and the cathode, the resistance across the conductive region 102 heats the conductive region and the first semiconductor region 110 in contact therewith. In the example shown in FIGS. 3 and 4, the heating of the first semiconductor region causes a dopant in the first semiconductor region to be driven therefrom, i.e., to diffuse outwardly, from the first semiconductor region 110 towards the second semiconductor region 112. In the example shown in FIG. 4, a dopant such as boron can be driven outwardly from the p+ doped first semiconductor region 110 into the third semiconductor region. As a result of the heating, the edge of the p+ doped first semiconductor region moves from an original location 140 to a post-heating location 142 which can overlap the edge 150 of the second semiconductor region 112. In some cases, the heating may also be sufficient to drive boron outwardly from the second semiconductor region 112 into the third semiconductor region 114, as illustrated by the movement of the edge of the second semiconductor region from an original location 148 before programming to a post-heating location 150. However, because the second semiconductor region in this embodiment is disposed at a greater distance from the conductive region 102 which is the source of the heating, the distance that the edge of the second semiconductor region moves from location 148 to 150 typically is not as great as the distance by which the edge of the first semiconductor region moves between locations 140 and 142.

In the example shown in FIG. 4, the edges of the first and second semiconductor regions overlap after programming the antifuse. However, in some cases, after applying the programming voltage, the edge of the first semiconductor region may move closer to the second semiconductor region without actually overlapping. In such case, it may still be possible to permanently decrease the resistance of the antifuse by one or more orders of magnitude when the distance between the final edges of the first and second semiconductor regions is small. For example, when the edges of the first and second semiconductor regions are still separated from each other after programming but by a very small distance of only a few nanometers, tunneling currents can still significantly reduce the resistance between the first and second semiconductor regions in the programmed device. In addition, by controlling the amount of the movement of the edge of the first semiconductor region as a result of programming the antifuse, other electrical characteristics of the field effect transistor behavior of the antifuse can be changed such as the saturation current, the threshold voltage, and the sub-threshold leakage current. The change of these characteristics can be exploited for a variety of applications. The above description of the operation of the antifuse is centered on the change of the off current of the field effect transistor as a result of programming. However, an application which is based on a change in one or more other electrical characteristics of the antifuse can also be within the scope of the invention.

The process of programming the antifuse can be carried out without melting the material of either the conductive region 102 or the first semiconductor region in contact therewith. In this way, the antifuse can be programmed in a less violent manner with more predictable results than many known electrically programmable fuses and antifuses. Greater reliability can be achieved when the programming of the antifuse does not rely on the violent destruction of a thin dielectric layer, in the manner that some electrical antifuses require, and does not scatter conductive material within a confined volume, in the manner that some electrical fuses operate.

Typically, when the programming voltage is applied, the antifuse is adapted to heat at least a portion of the first semiconductor region to a temperature greater than 700° C. One or more other parts of the body 101 may also reach a temperature of 700° C. during programming. In a particular case, at least a portion of the first semiconductor region and possibly one or more other parts of the body 101 reach a temperature greater than 700° C. during programming.

In a particular embodiment, the magnitude of the voltage applied between the anode and the cathode to program the antifuse is not greater than the magnitude of the voltage used to operate other devices on the same chip. For example, when the chip includes field effect transistors for which a voltage having a magnitude of one volt is applied between gate and source terminals, the magnitude of the voltage applied between the anode and the cathode for programming the antifuse can be one volt or less. In this way, the antifuse can be programmed using a power supply voltage which is available for other purposes on the chip, thus avoiding a need to provide a special power supply voltage for programming the antifuse.

Figure 5:
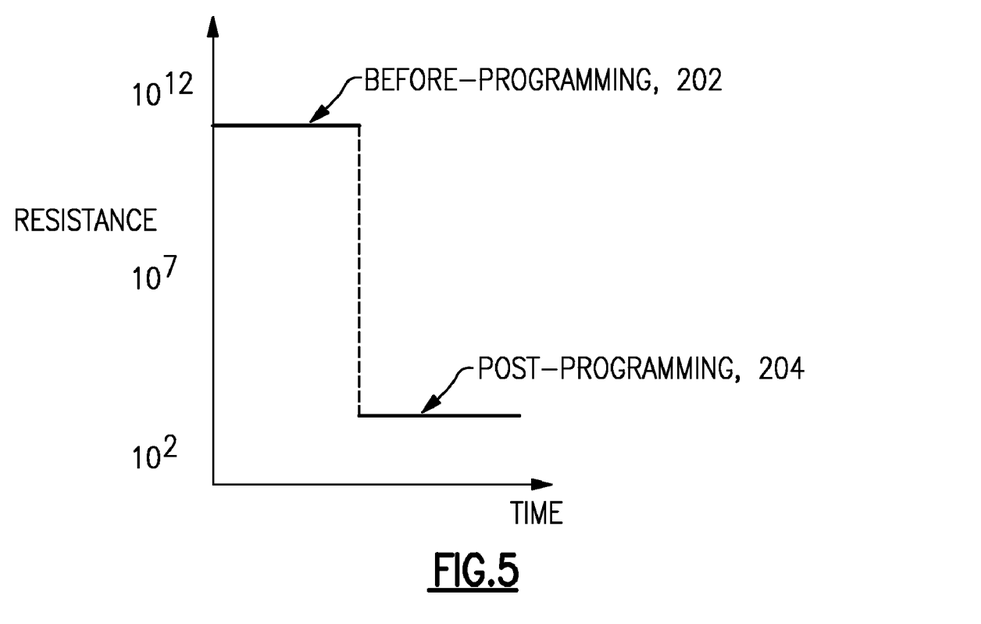
FIG. 5 is a graph illustrating electrical resistance levels before and after programming the antifuse.

The change in the resistance of the antifuse between the cathode and the Sense contact is illustrated in FIG. 5, which shows that, even on a logarithmic scale, the resistance undergoes a step change between an initial before-programming value 202 and a post-programming value 204. The resistance of the antifuse before and after programming between the first and second semiconductor regions can be determined by appropriate circuitry connected to at least the cathode 108 (FIG. 1) and the sense contact 124. The resistance typically is determined primarily by the resistance between the first and second semiconductor regions 110, 112. Programming of the antifuse typically causes a permanent reduction in the resistance by one or more orders of magnitude. In a particular embodiment, the resistance of the antifuse before the antifuse has been programmed can be greater than 100,000 ohms, and can be less than 10,000 ohms after the antifuse has been programmed. In a particular case, the programming of the antifuse can reduce the resistance between the first and second semiconductor regions by three to ten orders of magnitude.

Figure 6:
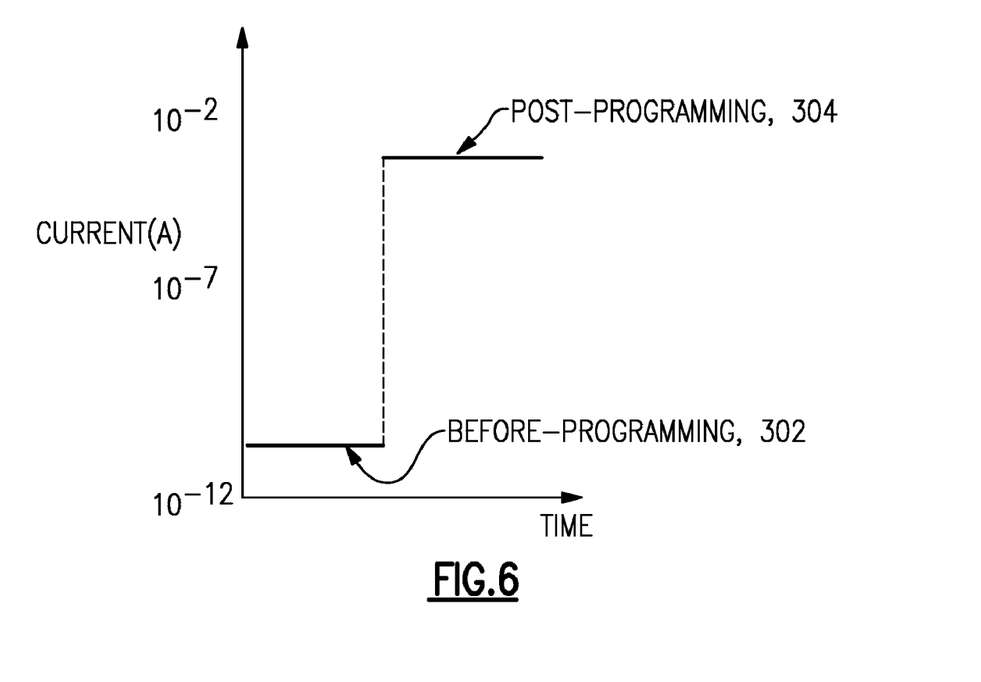
FIG. 6 is a graph illustrating amounts of current conducted through the antifuse before and after programming the antifuse.

The reduction in resistance greatly increases the amount of current which the antifuse conducts when the voltage on the gate is at a level which fully turns off transistor conduction that might otherwise occur between the first and second semiconductor regions of the antifuse. FIG. 6 is an illustrative example which plots the amount of current conducted by the antifuse in the before-programming state and in the post-programming state. The programmed or unprogrammed state of the antifuse can be determined at any time by appropriately biasing the gate 130, Sense contact 124 and cathode 108 and detecting whether an amount of current conducted between the cathode 108 and the Sense contact 124 corresponds to the programmed state or to the unprogrammed state. The voltage between the gate and the cathode 108 should be sufficient to switch off conduction between the first and second semiconductor regions when the antifuse has not yet been programmed. In one example, when the first and second semiconductor regions have p-type conductivity, and the third semiconductor region has n-type conductivity, the cathode can be held at a "low" voltage such as ground, and a "high" voltage can be applied to the Sense contact 124 and the gate. The gate of the antifuse can either be permanently tied to the high voltage, or can be raised to the high voltage at least whenever detecting the state of the antifuse, i.e., detecting whether or not the antifuse has been programmed. One way the state of the antifuse can be detected is to hold the gate and the Sense contact 124 at a suitable high voltage and detecting an amount of current through the Sense contact 124.

In one embodiment, the high and low voltages can be the same high and low voltages which represent the logic levels of transistors (e.g., field effect transistors) provided on the same integrated circuit chip as the antifuse. Therefore, when the logic levels used on the chip and 1 V for "high" and 0 V (or ground) for "low", the voltages used to bias the antifuse can also be 1 V and 0 V. In another embodiment, one or both of the high or low voltages can be different from the high and low voltages used as logic levels for transistors of the same chip.

As seen in FIG. 6, when the antifuse is biased as indicated above, the amount of current 302 conducted by the antifuse in the before-programming state is very small. In that state, the amount of current can be less than 1 microampere, and typically is one to several orders of magnitude smaller than 1 microampere, for example, 1 nanoampere ($10^{-9}$ amperes). On the other hand, after the antifuse has been programmed, the amount of current 304 conducted by the antifuse can be one or several orders of magnitude higher than the current in the before-programming state. In that case, the amount of current can increase to a value of about $10^{-3}$ amperes (1 milliampere).

In a variation of the above-described embodiment, the first and second semiconductor regions 110, 112 can have n-type conductivity (with n+ dopant concentrations) and the third region can have p-type conductivity. In such example, when the semiconductor region consists essentially of silicon, the n-type dopant can be arsenic or phosphorus. In such case, the antifuse when unprogrammed would have a structure similar to that of an n-type conductivity field effect transistor ("NFET"). The process of programming the antifuse is similar to that described above (FIGS. 1-6). Detecting the programmed or unprogrammed state of the antifuse should be done while avoiding transistor conduction between the first and second semiconductor regions 110, 112. To do so, the cathode can be held at a "low" voltage, i.e., a logic low level such as 0 V (ground) and a "low" voltage such as ground can be applied to the gate 130. The programmed or unprogrammed state of the antifuse can be determined by applying a "high" voltage to and measuring an amount of current through the Sense contact 124 under these conditions.

Figure 7:
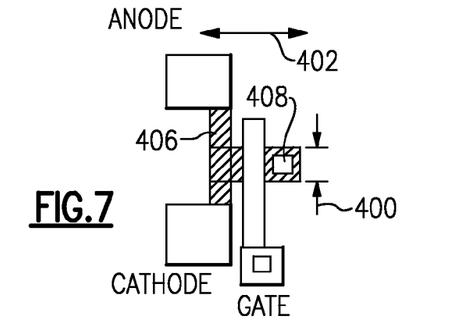
FIG. 7 is a plan view illustrating an antifuse according to a variation of the embodiment shown in FIGS. 1 and 2.

FIG. 7 illustrates a variation of the above-described embodiment (FIGS. 1-2) in which one of the dimensions of the active semiconductor region has been shortened. In this case, the active semiconductor region can have a shorter dimension or width 400 in a direction in which the long dimension of the conductive region 406 extends and can have a greater dimension or length 402 in a direction transverse to the direction of the long dimension of the conductive region 406. The resistance of the antifuse can be determined by detecting an amount of current through Sense contact 408 when applying a voltage between the contact 408 and one or both of the anode or cathode.

Figure 8:
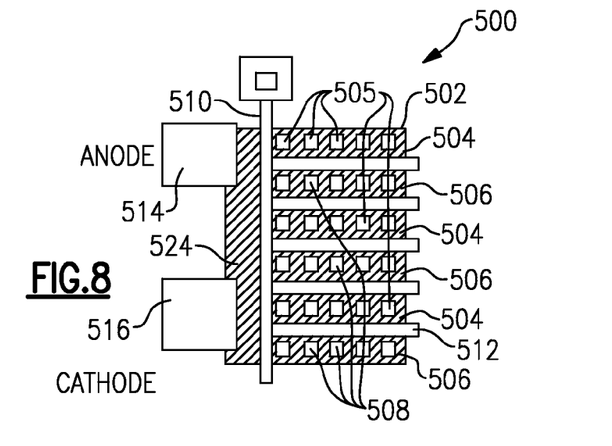
FIG. 8 is a plan view illustrating an antifuse according to another embodiment of the invention.

FIG. 8 illustrates an antifuse 500 according to another variation of the above embodiment (FIGS. 1-2). In this case, the active semiconductor region 502 includes a plurality of the first semiconductor regions 504 which are connected together in parallel through conductors 505 connected thereto. A plurality of second semiconductor regions 506 are also connected together in parallel through conductors 508 connected thereto. The first and second semiconductor regions have the same conductivity type, as described above. The gate of the antifuse includes a gate 510 and a plurality of fingers 512 which separate the first semiconductor regions from the second semiconductor regions. Third semiconductor regions (not visible in FIG. 8), having a different conductivity type than that of the first and second semiconductor regions, underlie the gate 510 and the fingers 512 and separate the first semiconductor regions from the second semiconductor regions. The conductive region 524 can overlie a semiconductor region which has either the same conductivity type as the first and second semiconductor regions or has the same conductivity type as the third semiconductor regions. In one preferred embodiment, the conductive region 524 is joined to a semiconductor region which has the same conductivity type as the first and second semiconductor regions and is heavily doped. In another embodiment, the conductive region 524 is joined to a semiconductor region having the same conductivity type as the third semiconductor regions, and which can be doped the same as the third semiconductor regions or be more heavily doped. When a programming voltage is applied between the anode 514 and the cathode 516 as described for the preferred embodiment, for example, with respect to FIGS. 1-6 above, the conductive region 524 heats up, causing a dopant in the first or second semiconductor regions or both to diffuse outwardly therefrom. At the same time, the dopant in the conductive region 524 can diffuse outwardly. Similar to the above-described programming operation, with sufficient heating, the edges of the first or second semiconductor regions, the semiconductor region underlying the conductive region, or a combination of them, move to an extent that causes the resistance of the antifuse 500 to permanently decrease by one or more orders of magnitude as compared with an initial resistance value before the antifuse is programmed. To sense the state of the antifuse: whether the antifuse has been programmed or not, a voltage can be applied to the gate 510 and fingers 512 which fully turns off transistor conduction of the antifuse. Conductors 508 can be electrically connected with the cathode 516 and the state of the antifuse can be determined by monitoring electrical behavior at conductors 505 connected to first semiconductor regions 504.

Figure 9:
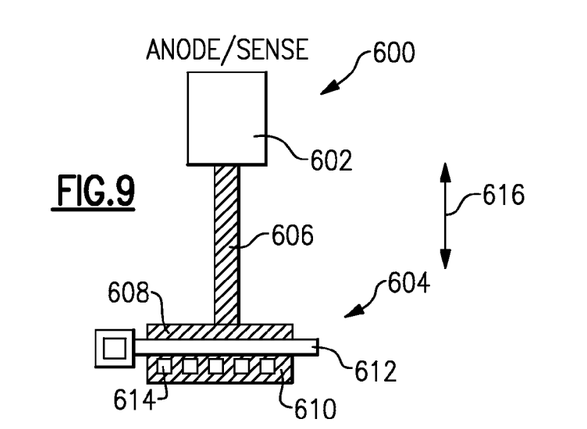
FIG. 9 is a plan view illustrating an antifuse according to yet another embodiment of the invention.

FIG. 9 illustrates an antifuse according to another variation of the embodiment above (FIGS. 1-2). The antifuse device incorporates an anode 602 which also functions as the sense contact. As in the above-described embodiment (FIGS. 1-2) the active semiconductor region 604 is a unitary body of monocrystalline semiconductor material which includes first and second semiconductor regions 608, 610 having the same first conductivity type. The first and second semiconductor regions are separated by a third semiconductor region having a second conductivity type which is different from the first conductivity type. In FIG. 9, the third semiconductor region is hidden from view by a gate 612 which extends over the same, such that the body of the antifuse and the gate operate as a field effect transistor before the antifuse is programmed. The gate 612 has the same function as in the above-described embodiment (FIGS. 1-2), as well an additional function in turning field effect transistor operation fully on, so as to operate the second semiconductor region 610 as a cathode during programming. A conductive region 606, such as described above (FIGS. 1-2) has a long dimension (length) extending between the anode 602 and the first semiconductor region 608. In this way, the long dimension of the conductive region 606 extends in a direction 616 which is transverse to a direction of the long dimension of the gate 612.

During an operation in which the state of the antifuse is sensed, the gate 612 can be biased at a voltage which keeps transistor conduction turned off between the first and second semiconductor regions of the antifuse. For example, when the first and second semiconductor regions have p-type conductivity, the bias voltage on the gate is set high to turn transistor conduction off. In one example, after programming the antifuse, the gate voltage 612 can be maintained at a bias voltage which keeps transistor conduction turned off.

In one embodiment, the antifuse can be programmed while biasing the gate at a voltage which permits transistor conduction between the first and second semiconductor regions 608, 610. A voltage then can be applied between the anode/sense contact 602 and the contacts 614 connected to the second semiconductor region 610. For example, when the first and second semiconductor regions have p-type conductivity and the third semiconductor region has n-type conductivity, the voltage on the gate can be set low, the voltage on the anode can be set high and the second semiconductor region 614 can be held at a lower voltage than the high voltage. In one example, the voltage at contacts 614 connected to the second semiconductor region 610 can be held at ground. Under such biasing conditions, a current will flow between the anode and the second semiconductor region 610, which heats the conductive region 606 as well as active semiconductor region 604. A temperature within the first semiconductor region 608 is raised sufficiently to cause a dopant within the first semiconductor region, and possibly the second semiconductor region, to diffuse outwardly therefrom into the third semiconductor region below the gate 612. This operation programs the antifuse in a manner as described above with reference to FIGS. 1-6 above. Thereafter, the bias voltage on the gate 612 is returned to a level which turns off transistor conduction, and the programmed or unprogrammed state of the antifuse can be determined by a sensing operation as described above.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. An antifuse, comprising:
    a unitary monocrystalline semiconductor body including first and second semiconductor regions each having the same first conductivity type being one of n-type or p-type, and a third semiconductor region between the first and second semiconductor regions having a second conductivity type being one of n-type or p-type, the second conductivity type being opposite the first conductivity type;
    an anode and a cathode electrically connected with the first semiconductor region;
    a region including at least one of a metal, a conductive compound or an alloy of a metal contacting the first semiconductor region and extending between the cathode and anode; and
    a contact electrically connected with the second semiconductor region,
    the antifuse being adapted such that application of a programming voltage between the anode and the cathode heats the first semiconductor region sufficiently to reach a temperature which drives a dopant outwardly therefrom, causing an edge of the first semiconductor region to move closer to an adjacent edge of the second semiconductor region, thus permanently reducing electrical resistance between the first and second semiconductor regions by one or more orders of magnitude.

2. The antifuse of claim 1, wherein the antifuse is adapted such that the application of the programming voltage causes the edge of at least the first semiconductor region to move sufficiently to overlap the adjacent edge of the second semiconductor region.

3. The antifuse of claim 2, wherein the resistance of the antifuse is higher than 100,000 ohms when the antifuse is in an unprogrammed state, and is less than 10,000 ohms when the antifuse is in a programmed state.

4. The antifuse of claim 2, wherein the antifuse is adapted such that the application of the programming voltage reduces resistance between the first and second semiconductor regions by three or more orders of magnitude.

5. An integrated circuit chip including the antifuse of claim 2, further comprising a field effect transistor, wherein a magnitude of the programming voltage is not greater than a magnitude of a gate-source voltage usable to switch the field effect transistor from fully off to fully on operation.

6. The antifuse of claim 5, wherein the antifuse is adapted such that the application of the programming voltage causes a change in an electrical characteristic of the field effect transistor of the antifuse, including at least one of saturation current, threshold voltage, off current, and sub-threshold leakage current.

7. The antifuse of claim 2, wherein the body is provided in an active semiconductor device layer of a silicon-on-insulator ("SOI") substrate, the SOI substrate including a bulk semiconductor layer and a buried dielectric layer separating the active semiconductor device layer from the bulk semiconductor layer.

8. The antifuse of claim 1, wherein the contact is usable to measure an electrical characteristic to detect whether or not the antifuse is in a programmed state.

9. The antifuse of claim 1, wherein the antifuse is adapted such that the application of the programming voltage heats the body to a temperature sufficient to cause movement of the edge of the first semiconductor region sufficient to produce the one or more order of magnitude reduction in resistance without melting either the region extending between the cathode and the anode or the semiconductor material of the body.

10. The antifuse of claim 1, further comprising a gate overlying the third semiconductor region.

11. The antifuse of claim 10, wherein the anode and the cathode are spaced apart in a direction parallel to a length of the gate.

12. The antifuse of claim 9, wherein while in an unprogrammed state, the first and second semiconductor regions are separated by a distance comparable to a width of the gate.

13. The antifuse of claim 10, including a plurality of the first semiconductor regions and a plurality of the second semiconductor regions, wherein the gate includes a plurality of fingers, each separating a second semiconductor region from a first semiconductor region.

14. The antifuse of claim 1, wherein the body is adapted to reach a temperature greater than 700° C. under application of the programming voltage.

15. The antifuse of claim 1, wherein the antifuse is adapted to cause movement in at least the edge of the first semiconductor region sufficient to produce the one or more order of magnitude reduction in resistance under application of the programming voltage for a period of less than 1000 microseconds.

16. The antifuse of claim 15, wherein the antifuse is adapted to reach a temperature of greater than 700° C. in the body and to cause movement in at least the edge of the first semiconductor region sufficient to produce the one or more order of magnitude reduction in resistance under application of the programming voltage for a period of less than 50 microseconds.

17. A method of programming an antifuse, comprising:
    providing an antifuse having a body including first and second semiconductor regions, the first and second semiconductor regions having the same first conductivity type being one of n-type or p-type, and a third semiconductor region between the first and second semiconductor regions having a second conductivity type being one of n-type or p-type, the second conductivity type being opposite the first conductivity type, the antifuse having an anode and a cathode electrically connected with the first semiconductor region, and a conductive region including at least one of a metal, a conductive compound of a metal or an alloy of a metal contacting the first semiconductor region and extending between the cathode and anode, and a contact electrically connected with the second semiconductor region; and applying a programming voltage between the anode and the cathode to heat the first semiconductor region sufficiently to reach a temperature which drives a dopant outwardly therefrom, causing an edge of the first semiconductor region to move closer to an adjacent edge of the second semiconductor region, thus permanently reducing electrical resistance between the first and second semiconductor regions by one or more orders of magnitude.

18. The method of claim 17, wherein the step of applying the programming voltage causes the body to reach a temperature greater than 700° C.

19. The method of claim 17, wherein the step of applying the programming voltage is performed for a period of less than 1000 microseconds.

20. The method of claim 19, wherein the step of applying the programming voltage is performed for a period of less than 50 microseconds and is sufficient to cause the body to reach a temperature greater than 700° C.

* * * * *